United States Patent [19]

Hayashi et al.

[11] Patent Number: 4,849,660
[45] Date of Patent: Jul. 18, 1989

[54] BICMOS OUTPUT INTERFACE CIRCUIT FOR LEVEL-SHIFTING ECL TO CMOS

[75] Inventors: Takehisa Hayashi, Kodaira; Kenichi Ishibashi; Toshio Doi, both of Kokubunji, all of Japan

[73] Assignee: Hitachi, Ltd., Tokyo, Japan

[21] Appl. No.: 201,961

[22] Filed: Jun. 3, 1988

[30] Foreign Application Priority Data

Jun. 5, 1987 [JP] Japan .................................. 62-139727

[51] Int. Cl.[4] .............................................. H03K 19/01
[52] U.S. Cl. ....................................... 307/475; 307/443; 307/446; 307/557; 307/246
[58] Field of Search ............... 307/443, 446, 448, 451, 307/455, 475, 552, 555, 557–559, 561, 565, 246, 570, 297

[56] References Cited

U.S. PATENT DOCUMENTS

| 3,649,843 | 3/1972 | Redwine et al. ............... 307/446 |
| 4,366,397 | 12/1982 | Kitamura et al. ............. 307/446 X |
| 4,645,951 | 2/1987 | Uragami ........................ 307/443 X |
| 4,646,124 | 2/1987 | Zunino ........................... 307/475 X |
| 4,656,372 | 4/1987 | Sani et al. ..................... 307/475 |
| 4,740,713 | 4/1988 | Sakurai et al. ................ 307/443 X |
| 4,751,410 | 6/1988 | Tanizawa ........................ 307/570 |
| 4,782,251 | 11/1988 | Tsugaru et al. ................ 307/475 |
| 4,794,317 | 12/1988 | van Tran ....................... 307/475 X |
| 4,798,981 | 1/1989 | Tsugaru et al. ................ 307/446 X |
| 4,798,983 | 1/1989 | Mori .............................. 307/570 |

OTHER PUBLICATIONS

"TTL Level High Speed BIFET Receiver", IBM T.D.B., vol. 30, No. 8, Jan. 1988, pp. 394-395.
Hudson et al., "An ECL Compatible 4K CMOS RAM", ISSCC '82 Digest of Technical Papers, pp. 248-249.

*Primary Examiner*—David Hudspeth
*Attorney, Agent, or Firm*—Antonelli, Terry & Wands

[57] ABSTRACT

An output interface circuit comprises a CMOS circuit including a pair of complementary MOS transistors and receiving an input signal at the gates of the paired MOS transistors, a bipolar transistor having its base connected to the output of the CMOS circuit and its emitter from which an output signal is delivered, and a control circuit connected between the paired MOS transistors and operable, upon the fall of the output signal, to cut off a current flowing through any one of the paired MOS transistors so as to control the low level at the output of the CMOS circuit such that the low level does not fall before a potential level by which the low level of the output signal is permitted to be at a desirable predetermined potential level. Specifically, the CMOS circuit includes a pair of complementary MOS transistors comprised of a P-type MOS transistor and an N-type MOS transistor and receives an input signal of CMOS level to operate in inverter fashion. The bipolar transistor connected to the output of the CMOS circuit operates as an emitter follower to deliver an output signal of ECL level. Upon the fall of the output signal, the control circuit operates to cut off a current flowing through the N-type MOS transistor so as to control the low level at the output of the CMOS circuit such that the low level does not fall below a level which is about 0.5 to 0.8 volts higher than the low level of the output signal (ECL level) of the bipolar transistor.

47 Claims, 8 Drawing Sheets

FIG. 7A    FIG. 7B
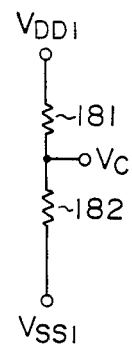
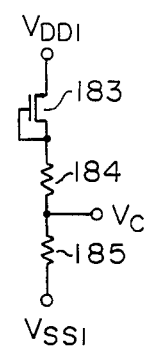
FIG. 8
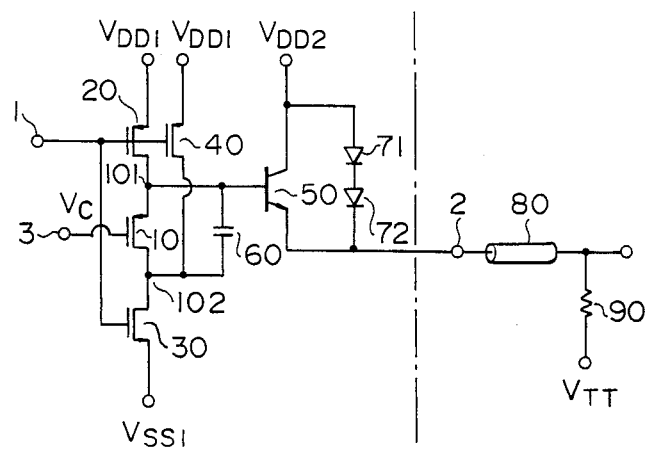

BICMOS OUTPUT INTERFACE CIRCUIT FOR LEVEL-SHIFTING ECL TO CMOS

BACKGROUND OF THE INVENTION

This invention relates to an output interface circuit for converting a signal level of CMOS (complementary metal oxide semiconductor) into a signal level of ECL (emitter coupled logic).

FIG. 1 exemplifies a conventional output interface circuit wherein a CMOS inverter comprised of a P-type MOS transistor 21 and an N-type MOS transistor 31 which are connected in series between first and second power supplies $V_{DD1}$ and $V_{SS1}$ has the output, 121, connected to the base of a bipolar transistor 51 which has its emitter connected to an output terminal 2 and its collector connected to a third power supply $V_{DD2}$ to operate as an emitter follower, so that a signal of CMOS level applied to an input terminal 1 is converted into a signal of ECL comparable level. In the following description, bipolar transistors are all assumed to be of the NPN type. Typically, the output terminal 2 is connected to a termination power supply $V_{TT}$ through a transmission line 80 having a constant characteristic impedance and a terminating resistor 90. For example, the characteristic impedance of the transmission line and the resistance of the terminating resistor are selected to be 50 Ω. The conventional output interface circuit constructed as above is disclosed in, for example, ISSCC '82 Digest of Technical Papers, pp 248-249.

In the circuit of FIG. 1, the delay time of circuit is disadvantageously increased upon the rise of output signal as will be described with reference to FIG. 2. Operation waveforms appearing at various points in the FIG. 1 circuit are diagrammatically shown in FIG. 2. In FIG. 2, voltage waveforms appearing at input terminal 1, terminal 121 and output terminal 2 upon the rise of input signal (upon the fall of output signal) are designated by 2001, 2011 and 2021, respectively. Also, voltage waveforms appearing at input terminal 1, terminal 121 and output terminal 2 upon the input fall (upon the output rise) are designated by 2002, 2012 and 2022, respectively. As an example, the first power supply $V_{DD1}$ is 0 (zero) volt (reference potential), the second power supply $V_{SS1}$ is −5.2 volts, the third power supply $V_{DD2}$ is 0 volt and the termination power supply $V_{TT}$ is −2.0 volts. When the low level (−5.2 volts) of CMOS level is applied to the input terminal 1, the N-type MOS transistor 31 is turned off and the P-type MOS transistor 21 is turned on to provide the high potential (about 0 volt) at the terminal 121, with the result that the base current flows through the bipolar transistor 51 to turn it on and a driving current is supplied from the power supply $V_{DD2}$ to the output terminal 2. At that time, potential $V_o$ at the output terminal 2 is given by $$V_o = V_{DD1} - (\Delta + V_{BE}) \simeq -0.9 \text{ (volts)} \quad (1)$$

which corresponds to the high level of ECL level, where $V_{BE} \simeq 0.7$ volts represents the base/emitter voltage of bipolar transistor 51 and Δ, which can be designed to approximate 0.2 volts, represents a voltage drop across the P-type MOS transistor 21 under the conduction of the base current through the bipolar transistor 51. Subsequently, when the CMOS level at input terminal 1 changes to the high level (0 volt) as shown at 2001, the N-type MOS transistor 31 is turned on and the P-type MOS transistor 21 is turned off, thereby changing the high level at terminal 121 to the low level (−5.2 volts) as shown at 2011. At that time, the bipolar transistor 51 becomes non-conductive with its base current almost cut off when the potential at the terminal 121 falls below a level (about −1.5 V to about −1.2 V) which is higher than $V_{TT}$ (−2.0 V) by $V_{BE}$ ($V_{BE}$ being about 0.5 to 0.8 volts depending on the base current and temperature). The potential at output terminal 2 thus changes from a high level to the low level (−2.0 volts) as shown at 2021.

Subsequently, the potential at input terminal 1 changes from high level to low level as shown at 2002 and then, the potential at terminal 121 changes to the high potential as shown at 2012. During this operation, the supply of base current to the bipolar transistor 51 is insufficient before the potential at terminal 121 starting from −5.2 volts reaches the threshold level (−1.5 to −1.2 volts) and as a result the potential at output terminal 2 remains at the low level to considerably delay the output rise in comparison with the output fall as will be seen from FIG. 2.

SUMMARY OF THE INVENTION

An object of this invention is to provide an output interface circuit capable of performing high-speed CMOS to ECL level conversion without increasing the delay time upon the output rise.

Another object of this invention is to provide an output interface circuit by which an increase in power consumption can be prevented even when an increase in delay time is managed to be suppressed.

According to the invention, an output interface circuit comprises a CMOS circuit including a pair of complementary MOS transistors and receiving an input signal at the gates of the paired MOS transistors, a bipolar transistor having its base connected to the output of the CMOS circuit and its emitter from which an output signal is delivered, and a control circuit connected between the paired MOS transistors and operable, upon the fall of the output signal, to cut off a current flowing through any one of the paired MOS transistors so as to control the low level at the output of the CMOS circuit such that the low level does not fall below a potential level by which the low level of the output signal is permitted to be at a desirable predetermined potential level.

Specifically, the CMOS circuit includes a pair of complementary MOS transistors comprised of a P-type MOS transistor and an N-type MOS transistor and receives an input signal of CMOS level to operate as an inverter. The bipolar transistor connected to the output of the CMOS circuit operates as an emitter follower to deliver an output signal of ECL level. Upon the fall of the output signal, the control circuit operates to cut off a current flowing through the N-type MOS transistor so as to control the low level at the output of the CMOS circuit such that the low level does not fall below a level which is about 0.5 to 0.8 volts higher than the low level of the output signal (ECL level) of the bipolar transistor.

Thus, in accordance with the invention, the output signal falls when the P-type MOS transistor is turned off and the N-type MOS transistor is turned on under the application of the high level ($V_{DD1}$) of the input signal, and upon the output fall, the control circuit controls the low level at the output of the CMOS circuit such that the base potential of the bipolar transistor is permitted to be at the predetermined level which is about 0.5 to 0.8 volts higher than the low level at the output terminal, thereby preventing the base potential of the bipolar transistor from decreasing until $V_{SS1}$. In this manner, the disadvantage of an increase in rise time encountered in the prior art can be suppressed.

Further, since in accordance with the invention the control circuit is connected between the P-type MOS transistor and N-type MOS transistor which are on/off operated by the input signal, there occurs no steady current flowing to the power supply $V_{SS1}$ in either case where the input signal level is high and it is low, and power consumption can therefore be reduced.

BRIEF DESCRIPTION OF THE DRAWINGS

FIGS. 6 to 14 are circuit diagrams illustrative of other embodiments of the invention.

DESCRIPTION OF THE PREFERRED EMBODIMENTS

Figure 3:
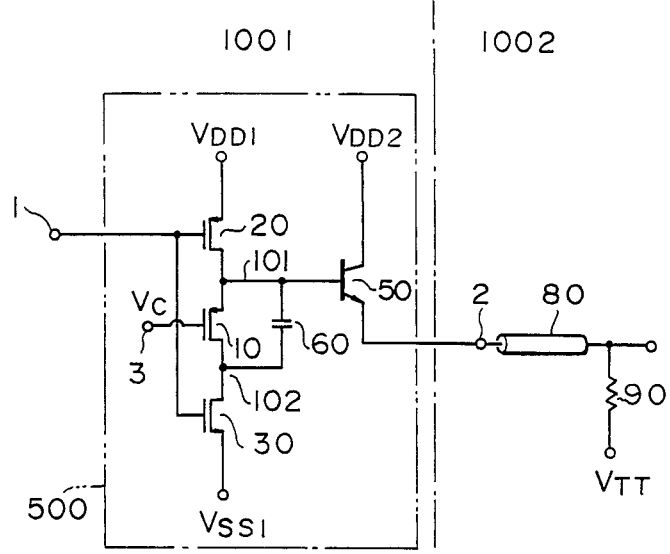
FIG. 3 is a circuit diagram illustrating an embodiment of an output interface circuit according to the invention.

FIG. 3 shows a circuit diagram of an embodiment of a CMOS to ECL level converting output interface circuit according to the invention. Referring to FIG. 3, the output interface circuit generally designated by reference numeral 500 comprises a CMOS circuit including a pair of complementary MOS transistors comprised of a P-type MOS transistor 20 and an N-type MOS transistor 30 which receive at their gates an input signal of CMOS level inputted through an input terminal 1, an emitter follower circuit comprised of a bipolar transistor 50 having its base connected to the output, 101, of the CMOS circuit and its emitter standing for an output terminal 2 from which an output signal of ECL level is delivered, and a control circuit comprised of a P-type MOS transistor 10 connected between the paired MOS transistors 20 and 30 and operable, upon the fall of the output signal, to cut off a current flowing through the N-type MOS transistor so as to control the low level at the output of the CMOS circuit such that the low level of the output signal is permitted to be at a desirable low level of ECL level. In the circuit 500 of this embodiment, a speed-up capacitor 60 in parallel with the control circuit is connected between the paired complementary MOS transistors 20 and 30. To describe the output interface circuit 500 in greater detail, the first P-type MOS transistor 20 has its source connected to a first power supply $V_{DD1}$ and its drain which is commonly connected, together with the source, 101, of the second P-type MOS transistor 10 constituting the control circuit, to the base of the NPN-type bipolar transistor 50 operable as an emitter follower. The drain of the P-type MOS transistor 10 is connected to the drain, 102, of the N-type MOS transistor 30. The source of the N-type MOS transistor 30 is connected to a second power supply $V_{SS1}$. The first P-type MOS transistor 20 and the first N-type MOS transistor 30 have their gates connected in common to the input terminal 1 to form the CMOS circuit which operates in inverter fashion. The bipolar transistor 50 has its collector connected to a third power supply $V_{DD2}$ and its emitter connected to the output terminal 2. A control voltage Vc is applied to the gate, designated by reference numeral 3, of the P-type MOS transistor 10 constituting the control circuit. The speed-up capacitor 60 is connected between the base of bipolar transistor 50 (the output of the CMOS circuit) and the drain 102 of the first N-type MOS transistor 30. The output terminal 2 is connected to a fourth power supply $V_{TT}$ through transmission line 80 and terminating resistor 90. The control voltage is of a potential level which permits the transistor 10 to be substantially turned off when the base of the bipolar transistor 50 is at a potential level which is about 0.5 to 0.8 volts higher than the output low level.

The CMOS circuit comprised of the first P-type MOS transistor 20 and the first N-type MOS transistor 30 and the control circuit comprised of the second P-type MOS transistor 10, as shown in FIG. 3, operate as will be described below with reference to FIG. 5.

Figure 5:
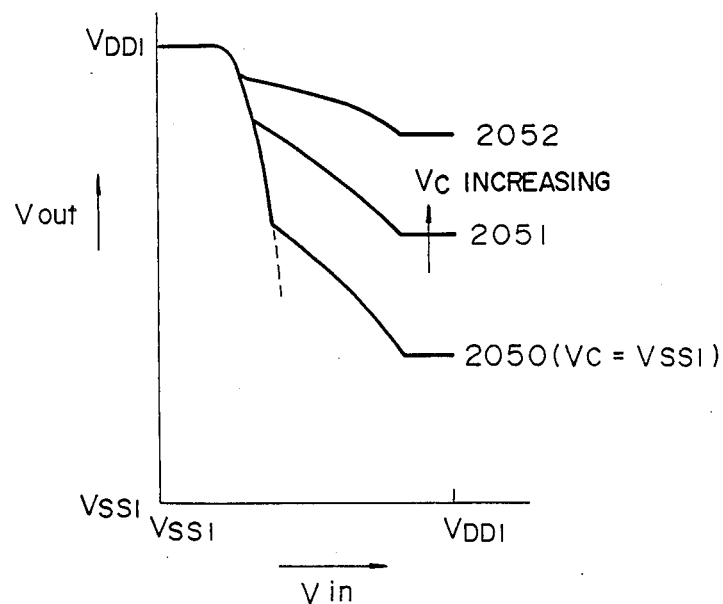
FIG. 5 is a graph for explaining the operation of a control circuit used in the invention.

FIG. 5 shows voltage transfer characteristics of the CMOS circuit obtained when the output of this circuit is opened or disconnected from the base of the bipolar transistor 50, where $V_{in}$ represents potential at the input terminal 1 and $V_{out}$ represents potential at the output 101 of the CMOS circuit or at the node where the first and second P-type MOS transistors are connected.

Referring to FIG. 5, when the input voltage $V_i$ equals the power supply $V_{SS1}$, the P-type MOS transistor 20 is turned on and the N-type MOS transistor 30 is turned off, with the result that the output voltage $V_{out}$ equals the power supply $V_{DD1}$ irrespective of the value of control voltage $V_c$. Subsequently, as the input voltage $V_{in}$ is increased toward $V_{DD1}$, the N-type MOS transistor 30 is turned on and the output voltage $V_{out}$ gradually decreases from $V_{DD1}$. The gradual decrease of output voltage $V_{out}$ reaching a given level causes the P-type MOS control transistor 10 to be gradually turned off and the output voltage $V_{out}$ does not fall below a predetermined level. The absolute value of gate/source voltage of the P-type MOS control transistor 10 applied with source potential of $V_{out}$ and gate potential of $V_c$ is decreased as $V_{out}$ decreases and eventually the P-type MOS control transistor 10 is turned off. Given that the P-type MOS control transistor 10 has a threshold voltage $V_{thp1}$, the P-type MOS control transistor 10 is not turned off when the output voltage $V_{out}$ satisfies a condition $$|V_{out} - V_C| > |V_{thp1}| \qquad (2)$$

and the lower limit of the output voltage $V_{out}$ is prescribed to be $$V_{out} = V_C + |V_{thp1}| \qquad (3)$$

FIG. 5 also demonstrates that with the input voltage $V_{in}$ equaling $V_{DD1}$ and with the P-type MOS transistor 20 consequently turned off and the N-type MOS transistor 30 turned on, the control transistor 10 is turned off when the output voltage $V_{out}$ decreases to reach the level indicated by equation (3). By varying the value of control voltage $V_c$, the low level of output voltage $V_{out}$ can be controlled as shown at curves 2050 to 2052 in FIG. 5. In particular, the curve 2050 is obtained when $V_c$ equals $V_{SS1}$ and the curves 2051 and 2052 are obtained when $V_c$ lies between $V_{SS1}$ and $V_{DD1}$.

Figure 1:
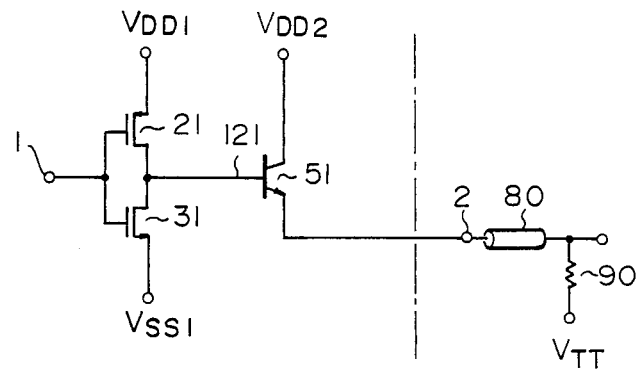
FIG. 1 is a circuit diagram illustrating a prior art CMOS to ECL level converting output interface circuit.
Figure 2:
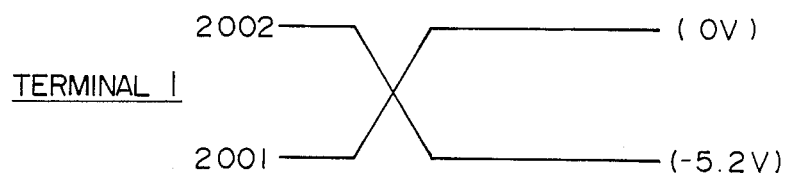
FIG. 2 is a waveform diagram useful in explaining the operation of the FIG. 1 circuit.
Figure 2:
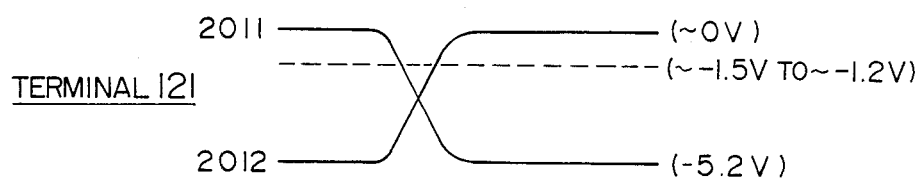
Figure 2:
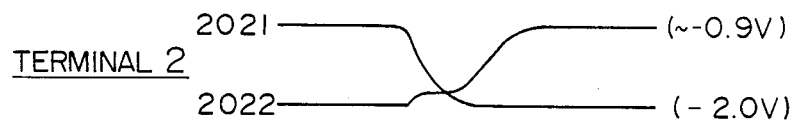
Figure 4:
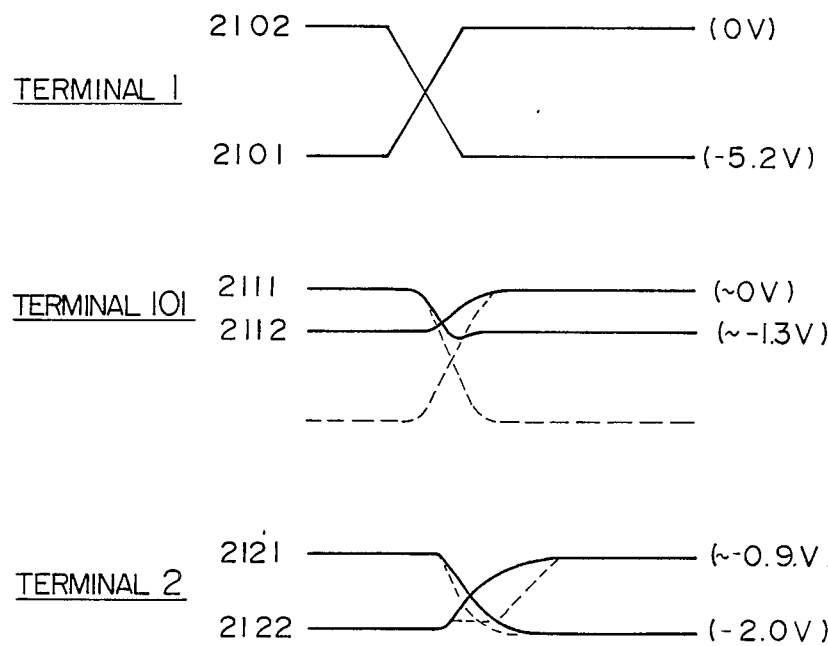
FIG. 4 is a waveform diagram useful in explaining the operation of the FIG. 3 circuit.

Then, the output interface circuit 500 shown in FIG. 3 has a transient response as will be described below with reference to FIG. 4. Operation waveforms appearing at various points in the FIG. 3 embodiment are diagrammatically shown in FIG. 4, with voltage waveforms appearing at input terminal 1, terminal 101 and output terminal 2 upon the input rise (upon the output fall) respectively designated by 2101, 2111 and 2121 and with voltage waveforms appearing at input terminal 1, terminal 101 and output terminal 2 upon the input fall (upon the output rise) respectively designated by 2102, 2112 and 122. As in the prior art example, the first power supply $V_{DD1}$ is 0 volt (reference potential), the second power supply $V_{SS1}$ is −5.2 volts, the third power supply $V_{DD2}$ is 0 volt and the termination power supply $V_{TT}$ is −2.0 volts. When the input voltage applied to the input terminal 1 changes from low level (−5.2 volts) to high level (0 volt) as shown at 2101, the potential at node 101 changes from high level (about 0 volt) to low level (potential determined by the control voltage $V_c$ explained in connection with FIG. 5) as shown at 2111 in FIG. 4. In FIG. 4, for the low level at output terminal 2 being −2.0 volts, the low level at node 101 is particularly selected to be about −1.3 volts a which the bipolar transistor 50 is substantially turned off. The decrease of the potential at terminal 101 is completed rapidly by the transient current flowing through the speed-up capacitor 60 in addition to the current flowing through the control transistor 10. The transient current is due to the fact that upon the output fall, the potential at node 102 is abruptly decreased by the N-type MOS transistor 30. In response to the waveform 2111, the output potential at output terminal 2 changes as shown at 2121 in FIG. 4. Subsequently, the input voltage at input terminal 1 changes from high level (0 volt) to low level (−5.2 volts) as shown at 2102 in FIG. 4 and the potential at node 101 changes from low level to high level as shown at 2112. Since the low level of potential at the node 101 is so selected as described previously, the potential at output terminal 2 begins to rise as shown at 2122 as soon as the P-type MOS transistor 20 is turned on to cause the potential at node 101 to start rising. In comparison with the prior art waveforms of FIG. 2 also illustrated at dashed curves in FIG. 4, it will be seen that the delay time upon the output rise can be improved greatly to suppress the delay time disadvantageously caused upon the output rise in the conventional circuit. Although in this embodiment the delay time upon the output fall is slightly greater than that in FIG. 2, this delay is so small as to be incomparable to the reduction in delay time upon the output rise. Practically, the design speed of the circuit is limited by greater delay in rise time or fall time and the large improvement in delay time upon the output rise in this embodiment, which removes the design obstacles in the conventional circuit, evidences the effects of the present invention.

Preferably, the output interface circuit 500 may be realized with a semiconductor integrated circuit in which parasitic capacitance associated with individual elements can be decreased to permit high-speed operation. This holds true for other embodiments to be described later.

The N-type MOS transistor and P-type MOS transistors used in the FIG. 3 circuit can be prepared through known CMOS fabrication process. As the bipolar transistor 50, a lateral transistor which can be prepared through the CMOS fabrication process may be used or a transistor prepared through known bipolar CMOS (Bi-CMOS) fabrication process may alternatively be used.

Figure 6:
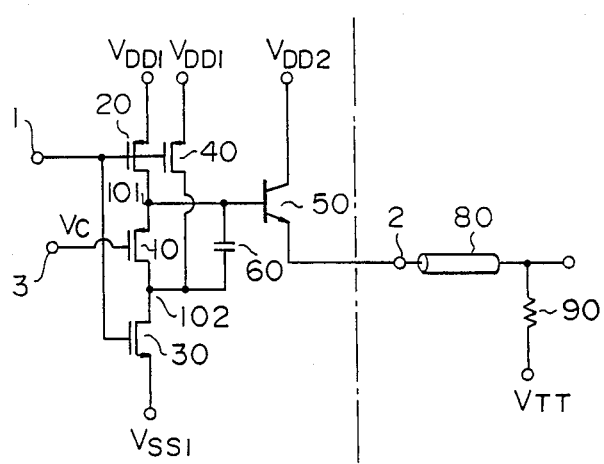

FIG. 6 shows another embodiment of the invention. Referring to FIG. 6, this embodiment particularly adds to the FIG. 3 construction a third P-type MOS transistor 40 having its drain connected to the drain 102 of the P-type MOS control transistor 10, its gate connected to the input terminal 1 and its source connected to the first power supply $V_{DD1}$. The FIG. 6 embodiment 1 changes from high level ($V_{DD1}$) to low level upon the output rise, the potential at node 102 is rapidly raised to $V_{DD1}$ by the action of the third P-type MOS transistor 40. Even in the case of the FIG. 3 circuit removed of the third P-type MOS transistor 40, the potential at node 102 can be raised to $V_{DD1}$ through the control transistor 10 but the rise time at the node or drain 102 is greater than at the source 101 of the control transistor 101. With the construction of FIG. 6, the time required for the potential at node 102 to reach the stationary state can be reduced. Accordingly, this embodiment can permit high-speed circuit operation even when the input signal applied to the input terminal 1 is affected by, for example, logical hazards to oscillate within a short period of time.

FIGS. 7A and 7B illustrate examples of a control voltage generator for generating the control voltage $V_c$ applied to the output interface circuits shown in FIGS. 3 and 6. In order to provide a low potential level of $V_{outL}$ at the output (node 101) of the CMOS circuit shown in FIGS. 3 and 6, equation (3) prescribes $$V_c = V_{outL} - V_{thp1} \qquad (4)$$

Given that $V_{outL}$ equals −1.3 volts and the substrate (or well) potential of the P-type MOS control transistor 10 is $V_{DD1}$, the threshold voltage $V_{thp1}$ inclusive of the substrate effect is typically about −1.2 volts and the control voltage $V_c$ may be set to about −2.5 volts. In the simplest control voltage generator as shown in FIG. 7A, the voltage between the power supplies $V_{DD1}$ and $V_{SS1}$ is divided by resistors 181 and 182 connected in series to provide the control voltage $V_c$. In another control voltage generator as shown in FIG. 7B, a P-type MOS transistor 183 is provided having its source connected to the power supply $V_{DD1}$ and its gate and drain connected in common to one end of a first resistor 184, and the other end of the resistor 184 is connected to an output terminal for delivery of the control voltage and to one end of a second resistor 185 having the other end connected to the power supply $V_{SS1}$. As is clear from equation (3), the low level at the node 101 shown in FIGS. 3 and 6 depends on the threshold voltage of the P-type MOS control transistor 10. The larger the absolute value of threshold voltage of the transistor 10, the lower the value of control voltage $V_c$ is required to reduce this dependency. In FIG. 7B, the larger the absolute value of the threshold voltage of the transistor 183, the lower the value of the $V_c$ becomes and consequently the low level of potential at the node 101 less depends on the threshold voltage.

FIG. 8 shows a further embodiment of the invention. Referring to FIG. 8, this embodiment particularly adds to the construction of the FIG. 6 embodiment clamping diodes 71 and 72 connected in series between the third power supply $V_{DD2}$ and the output terminal 2. With the FIG. 6 construction, when the output (the potential at output terminal 2) is at the low level, the base current is not supplied to the bipolar transistor 50 to turn it off so that the potential at output terminal 2 equals $V_{TT}(-2.0$ volts). In this embodiment of FIG. 8, however, because of the provision of the clamping diodes 71 and 72, the low level at output terminal 2 can be maintained at the low level of ECL level which is typically about $-1.7$ volts.

Figure 9:
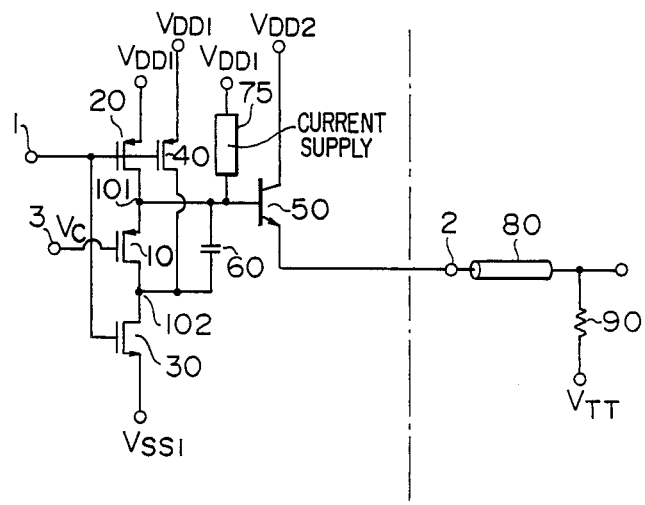

FIG. 9 shows still another embodiment of the invention. This embodiment particularly adds to the construction of the FIG. 6 embodiment a current supply means 75 connected between the first power supply $V_{DD1}$ and the base of bipolar transistor 50. Since in this embodiment the base current is supplied from the power supply $V_{DD1}$ to the bipolar transistor 50 through the current supply means 75 when the output is at the low level, the bipolar transistor 50 is not turned off even when the output is at the low level. By selecting a proper impedance of the current supply means 75, the output low level at output terminal 2 can be maintained at about $-1.7$ volts as in the case of the FIG. 8 embodiment. The FIG. 9 construction is advantageous in that the current supply means 75 is required to pass only the base current to the bipolar transistor 50 and can be realized in a smaller area than the diodes 71 and 72 of the FIG. 8 embodiment. For example, a resistor, a diode or a MOS transistor may be used individually or in combination as the current supply means 75.

Figure 10:
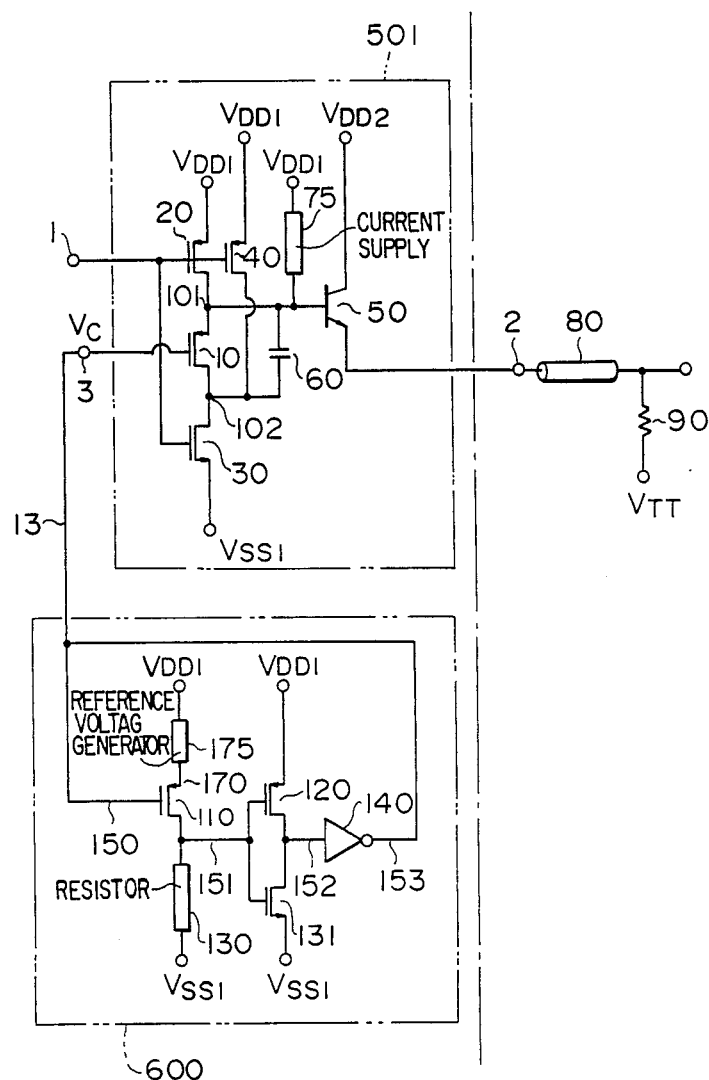

FIG. 10 shows still another embodiment of the invention wherein a separate control voltage generator 600 is used. Referring to FIG. 10, the output of the control voltage generator 600 is connected by a control voltage line 13 to a control terminal 3 of an output interface circuit 501 having the same construction as the FIG. 9 embodiment. The control voltage generator 600 comprises a reference voltage generator means 175 connected between the first power supply $V_{DD1}$ and the source, 170, of a P-type MOS transistor 110, and a resistor means 130 connected between the drain, 151, of MOS transistor 110 and the second voltage supply $V_{SS1}$. The drain 151 of MOS transistor 110 is connected to the input of a first CMOS inverter comprised of a P-type MOS transistor 120 and an N-type MOS transistor 131, the gates of these MOS transistors being connected together to form the input of the first CMOS inverter. The output, 152, of the first inverter is connected to the input of a second inverter 140 having its output 153 fed back to the gate, 150, of the MOS transistor 110 and connected to the control voltage line 13.

The P-type MOS transistor 110 has substantially the same configuration as the P-type MOS control transistor 10 of the output interface circuit 501 and the resistor means 130 has equivalence to a high-resistance resistor in operation. Especially, in the present embodiment, the output interface circuit 501 and control voltage generator 600 may preferably be integrated in the same chip on a semiconductor substrate and the transistor 110 and control transistor 10 have substantially the same characteristic.

With this construction, when current flowing through the MOS transistor 110 increases, the potential at drain 151 is raised because the resistor means 130 acts as the high-resistance resistor, thus lowering the potential at output 152 and raising the potential at output 153 and gate 150. As a result, the absolute value of gate/source voltage of the MOS transistor 110 is decreased to decrease the current flowing through the MOS transistor 110 so as to ultimately keep the current in MOS transistor 110 constant. In the converse case, the potential at inverter output 153 similarly changes to keep the current in MOS transistor 110 constant under the influence of the feedback operation. The value of control voltage $V_c$ thus balances at a level at which the potential at drain 151 equals an input logic threshold of the inverter comprised of the MOS transistors 120 and 131. Accordingly, by setting the equivalent resistance of the resistor means 130 to a large value, the current (referred to as a current $I_L$ hereinafter) flowing through the MOS transistor 110 can be small. Under the conduction of current $I_L$, the potential at source 170 is lower than $V_{DD1}$ by a voltage drop developed across the reference voltage generator 175 due to the current $I_L$ and will be referred to as a reference voltage $V_L$ hereinafter. In the output interface circuit 501, on the other hand, when neglecting the base current of the bipolar transistor 50, a current substantially equal to the current $I_L$ flows through the MOS control transistor 10 in response to the application of the input high level ($V_{DD1}$) because the MOS control transistor 10 has substantially the same characteristic as the MOS transistor 110 included in the control voltage generator and as a result the low level at node 101 substantially equals the reference voltage $V_L$. Accordingly, even when admitting variations in characteristics of elements from chip to chip, the control voltage generator of FIG. 10 ensures that the signal amplitude developing at the node 101 can always be made to be substantially equal to the reference voltage generated by the reference voltage generator means 175. Even under the above condition that no base current flows through the bipolar transistor 50 or the output terminal 2 is opened, the current flowing to the power supply $V_{SS1}$ through the current supply means 75 and MOS control transistor 10 is limited to a small value which substantially equals the current $I_L$. With the output terminal 2 loaded to permit the base current of bipolar transistor 50 to pass through the current supply means 75, a voltage drop develops across the current supply means 75 and the low level at node 101 falls slightly below the reference voltage $V_L$. In practical use, the steady current flowing to the power supply $V_{SS1}$ can therefore be as small as negligible.

The control circuit 600 in FIG. 10 is described as being used in combination with the output interface circuit of FIG. 9 but it may obviously be combined with the output interface circuits of FIGS. 3, 6 and 8. This modification is removed of the current supply means 75 and differs from the FIG. 10 embodiment in that no current flows through the MOS control transistor 10, but it resembles the FIG. 10 embodiment in that the control voltage $V_c$ is controlled such that when the potential at node 101 substantially equals the potential at source 170, the MOS control transistor 10 is substantially turned off The resistor means 130 used in the FIG. 10 embodiment may be of a resistor formed of a diffusion layer or polysilicon layer in a semiconductor or may be of a MOS transistor. The reference voltage generator means 175 may be of any type which can respond to the current $I_L$ to provide a potential drop that leads to the generation of the reference voltage $V_L$. Conveniently, as the reference voltage generator means, a resistor means similar to the resistor means 30 or a means using the forward voltage of a junction diode or of a bipolar transistor with its base and collector shorted to each other may be used individually or in combination.

Figure 11:
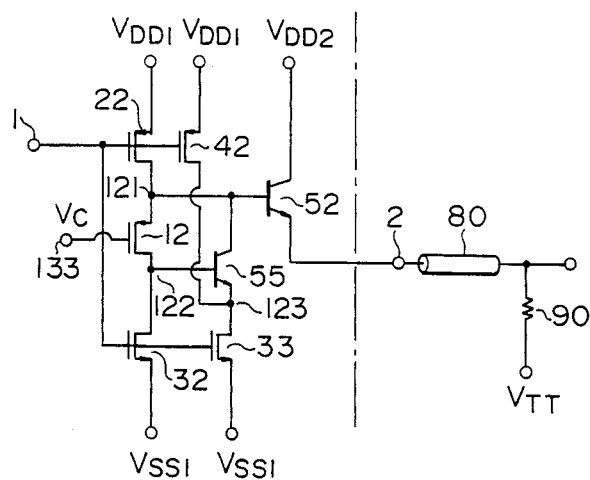

Still another embodiment of the invention will be described with reference to FIG. 11. In FIG. 11, a first P-type MOS transistor 22 has its source connected to a first power supply $V_{DD1}$ and its drain connected to the source, 121, of a second P-type MOS transistor 12 constituting a control circuit (current cut-off circuit) and to the base of a first NPN-type bipolar transistor 52 which operates as an emitter follower. The drain of the first N-type MOS transistor 32 is connected to the drain, 122, of a first N-type MOS transistor 32 having its source connected to a second power supply $V_{SS1}$. The first P-type MOS transistor 22 and first N-type MOS transistor 32 have their gates connected in common to an input terminal 1 to form a CMOS circuit which operates in inverter fashion. The bipolar transistor 52 has its collector connected to a third power supply $V_{DD2}$ and its emitter connected to an output terminal 2. The gate, 133, of the second P-type MOS transistor 12 constituting the control circuit is applied with a control voltage $V_c$ and the output terminal 2 is connected to a fourth power supply $V_{TT}$ through a transmission line 80 having a constant characteristic impedance and a terminating resistor 90. The above construction is the same as that of the FIG. 3 embodiment. The FIG. 11 embodiment further comprises a second NPN-type bipolar transistor 55 having its collector connected to the node 121, its base connected to the node 122 and its emitter connected to the drain, 123, of a second N-type MOS transistor 33 which has its gate connected to the input terminal 1 and its source connected, like the source of the first N-type MOS transistor 32, to the power supply $V_{SS1}$, and a third P-type MOS transistor 42 having its drain connected to the emitter of the second bipolar transistor 55 and its source and gate respectively connected, like the source and gate of the first P-type MOS transistor 22, to the power supply $V_{DD1}$ and input terminal 1.

In comparison with the FIG. 6 embodiment, the present embodiment particularly omits the speed-up capacitor 60 but instead adds the second bipolar transistor 55 and the second N-type MOS transistor 33. In this embodiment, when the potential at input terminal 1 changes from low level ($V_{SS1}$) to high level ($V_{DD1}$), the second N-type MOS transistor 33 is turned on and consequently the base current is supplied to the second bipolar transistor 55 through the second P-type MOS transistor 12 to turn on the second bipolar transistor 55. As a result, the potential at node 121 decreases rapidly. As in the case of the FIG. 6 embodiment, with the potential at the node 121 lowered to reach the level given by equation (3), the second P-type MOS transistor 12 is turned off and the supply of base current to the second bipolar transistor 55 ceases. At that time, the first N-type MOS transistor 32 is being rendered on and consequently electric charges in the base of the second bipolar transistor 55 is rapidly drawn through the first N-type MOS transistor 32 to thereby turn off the second bipolar transistor 55 rapidly. Thus, with the construction of this embodiment, high-speed circuit operation can advantageously be achieved without resort to the speed-up capacitor 60 of relatively large area needed by the FIG. 6 embodiment. In this embodiment, when the potential at input terminal 1 changes from high level ($V_{DD1}$) to low level ($V_{SS1}$), the N-type MOS transistors 32 and 33 are turned off and the P-type MOS transistors 22 and 42 are turned on, with the result that the potential at nodes 121 and 123 increases rapidly and the potential at output terminal 2 rapidly changes to high level (about −0.9 volts).

Figure 12:
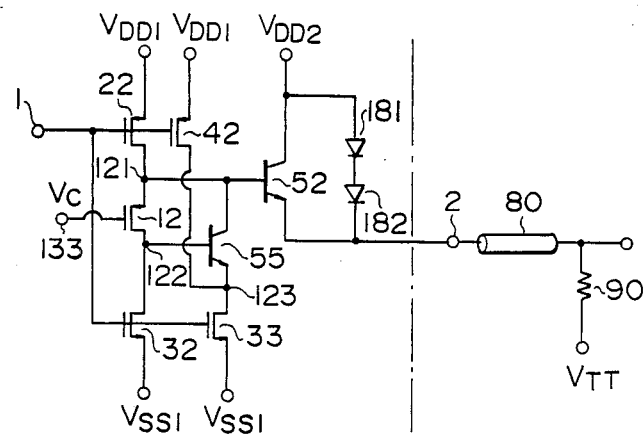

FIG. 12 shows a further embodiment of the invention. Specifically, this embodiment of FIG. 12 adds to the construction of the FIG. 11 embodiment clamping diodes 181 and 182 connected in series between the second power supply $V_{DD2}$ and the output terminal 2. The FIG. 12 construction is advantageous over the FIG. 11 construction as the FIG. 8 embodiment is so over the FIG. 6 embodiment.

Figure 13:
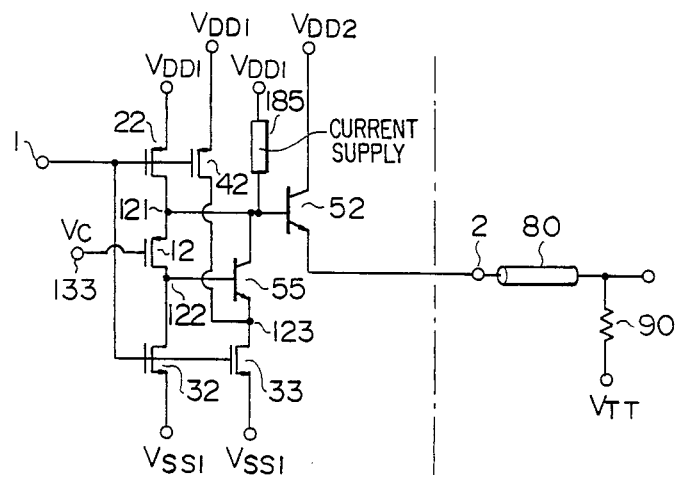

FIG. 13 shows a further embodiment of the invention which particularly adds to the construction of the FIG. 11 embodiment a current supply means 185 connected between the first power supply $V_{DD1}$ and the base of the bipolar transistor 52. As in the case of the FIG. 9 embodiment, when the output level at the node 121 is low, the base current is supplied to the first bipolar transistor 52 by means of the current supply mean 185 and the output low level at the output terminal 2 can be maintained at the low level of ECL level which is typically about −1.7 volts. Structurally, the current supply means 185 can be realized in the same manner as the current supply means 75 of the FIG. 9 embodiment.

Figure 14:
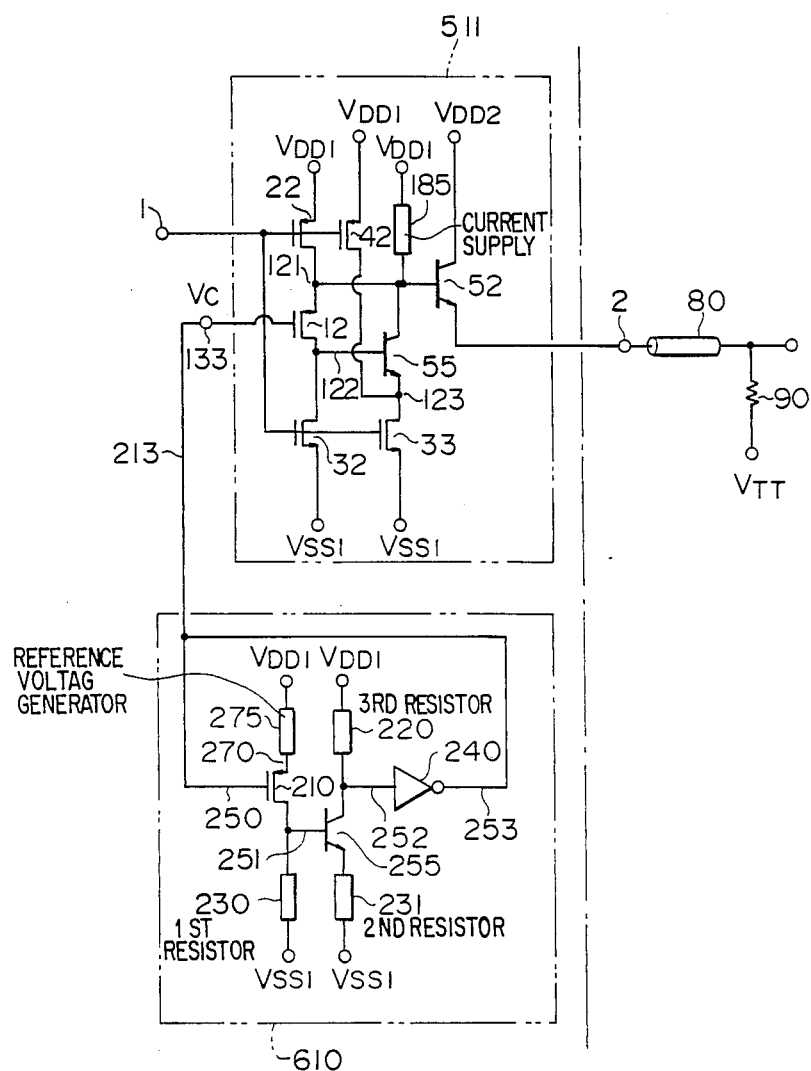

FIG. 14 shows an example of a control voltage generator suitable for use with the output interface circuits in the embodiments of FIGS. 11, 12 and 13. Referring to FIG. 14, the output of the control voltage generator generally designated by reference numeral 610 interface circuit 511 having the same construction as the FIG. 13 embodiment through a control voltage line 213. In the control voltage generator 610, a reference voltage generator means 275 is connected between a first power supply $V_{DD1}$ and the source, 270, of a P-type MOS transistor 210, and a first resistor means 230 is connected between the drain, 251, of the P-type MOS transistor 210 and a second power supply $V_{SS1}$. The base of an NPN-type bipolar transistor 255 is connected to the drain 251. Connected between the emitter of bipolar transistor 255 and the second power supply $V_{SS1}$ is a second resistor means 231, and connected between the collector, 252, of bipolar transistor 255 and the first power supply $V_{DD1}$ is a third resistor means 220. The collector 252 is connected to the input of an inverter 240 having its output 253 connected to the control voltage line 213 so as to be fed back to the gate, 250, of P-type MOS transistor 210. The P-type MOS transistor 210 and bipolar transistor 255 respectively have substantially the same construction a the P-type MOS control transistor 12 and bipolar transistor 55 of the output interface circuit 511, and the resistor means 230 and 220 have equivalence to a high-resistance resistor in operation.

Especially, in the present embodiment, the output interface circuit 511 and control voltage generator 610 may preferably be integrated in the same chip on a semiconductor substrate so that the transistor 210 and control transistor 12 can have substantially the same characteristic and the transistors 255 and 55 can have substantially the same characteristic. With this construction, when the current flowing through the P-type MOS transistor 210 increases to increase the base current of bipolar transistor 255, the collector current of bipolar transistor 255 is increased, thereby lowering the potential at node 252 and raising the potential at output 253. As a result, the absolute value of gate/source voltage of the P-type MOS transistor 210 is decreased to decrease the current flowing through the P-type MOS transistor 210 so as to ultimately keep constant currents in P-type MOS transistor 210 and bipolar transistor 255.

This effect is based on similar negative feedback explained in connection with the FIG. 9 embodiment. In the converse case, the potential at inverter output 253 or at gate 250 similarly changes to keep constant currents in transistors 210 and 255. Thus, the value of control voltage V (the potential at control voltage line 213) balances at a level at which the potential at collector 252 equals an input logic threshold of the inverter 240. Accordingly, by setting the equivalent resistance of the resistor means 220 to a large value, the current (referred to as a current $I_{L1}'$ hereinafter) flowing through the bipolar transistor 255 can be sufficiently small. Also, by setting the equivalent resistance of the resistor means 230 to a large value, the current (referred to as a current $I_{L2}'$ hereinafter) flowing through the P-type MOS transistor 210 can be sufficiently small. Under the conduction of current $I_{L2}'$, the potential at source 270 is lower than $V_{DD1}$ by a voltage drop across resistor means 275 due to the current $I_{L2}'$ and will be referred to as a voltage $V_L'$ hereinafter.

In the output interface circuit 511, on the other hand, when neglecting the base current of the bipolar transistor 52, a current substantially equal to the current $I_{L2}'$ in the MOS transistor 210 flows through the MOS transistor 12 in response to the application of the input high level ($V_{DD1}$) when the potential at node 121 is $V_L'$ because the MOS transistor 12 has substantially the same characteristic as the MOS transistor 210. Under this condition, with the equivalent resistance of the N-type MOS transistor 32 designed to be smaller than the resistance of the resistor means 230, the base current of the bipolar transistor 55 is smaller than that of the bipolar transistor 255 and hence the collector current of the bipolar transistor 55 falls below the collector current $I_{L1}'$ of the bipolar transistor 255 to take a sufficiently small value. With the equivalent resistance of the N-type MOS transistor 32 designed to be of a suitable value, when the potential at node 121 exceeds $V_L'$, the base current flows through the bipolar transistor 55 to turn it on and the potential at node 121 can be maintained at a level which is very close to $V_L'$. Accordingly, even when admitting variations in characteristics of elements from chip to chip, the control voltage generator of FIG. 14 ensures that the signal amplitude developing at the node 121 can always be made to be substantially equal to the reference voltage generated by the reference voltage generator means 275. Even under the above condition that the output terminal 2 is opened and no base current flows through the bipolar transistor 52, the current flowing to the power supply $V_{SS1}$ through the MOS control transistor 12 and bipolar transistor 55 is limited to a small value which is smaller than the sum of currents $I_{L1}'$ and $I_{L2}'$. With the outer terminal 2 loaded to permit the base current of bipolar transistor 52 to pass through the current supply means 185, a voltage drop develops across the current supply means 185 and the low level at node 121 falls slightly below the voltage $V_L'$. In practical use, the steady current flowing to the power supply $V_{SS1}$ can therefore be as small as negligible.

As in the case of the FIG. 10 embodiment, the control circuit 610 used in combination with the output interface circuit of FIG. 13 in the FIG. 14 embodiment may otherwise be combined with the output interface circuits of FIGS. 12 and 11.

Structurally, the reference voltage generator means 275 and resistor means 230, 231 and 220 can be realized in the same manner as the reference voltage generator means 175 and resistor means 130 of the FIG. 10 embodiment.

It is desired for the purpose of high-speed operation that bipolar transistors of excellent high frequency characteristic (having a high transit frequency $f_T$ and a small parasitic capacitance) be used as the bipolar transistors 55 and 255. In this respect, these bipolar transistors may preferably be prepared through known bipolar CMOS (Bi-CMOS) fabrication process rather than CMOS fabrication process.

As described above, according to the invention, the low level of a signal applied to the base of the output bipolar transistor can be prevented from decreasing excessively while the steady flow of current in the circuit being suppressed to as small a value as almost negligible and a low-power consumptive CMOS to ECL level converting output interface circuit capable of permitting high-speed operation upon the output rise and output fall can be obtained.

We claim:

1. An output interface circuit comprising:
    a CMOS circuit including a pair of complementary MOS transistors and receiving an input signal at the gates of said paired MOS transistors;
    a bipolar transistor having its base connected to the output of said CMOS circuit and its emitter from which an output signal is delivered; and
    a control circuit connected between said paired MOS transistors and operable, upon the fall of said output signal, to cut off a current flowing through any one of said paired MOS transistors so as to control the low level at the output of said CMOS circuit such that the low level does not fall below a potential level by which the low level of said output signal is permitted to be at a desirable predetermined potential level.

2. An output interface circuit according to claim 1 wherein said control circuit comprises a MOS transistor having its source and drain connected between said paired MOS transistors and its gate applied with a control signal.

3. An output interface circuit according to claim 1 further comprising a capacitor connected in parallel with said control circuit between said paired MOS transistors.

4. An output interface circuit according to claim 2 further comprising a MOS transistor having its gate connected to receive the input signal, its drain connected to the drain of said MOS transistor constituting said control circuit and its source connected to a first power supply.

5. An output interface circuit according to claim 1 further comprising means, connected to the emitter of said bipolar transistor, for clamping the low level of said output signal.

6. An output interface circuit according to claim 1 further comprising means for supplying current to the base of said bipolar transistor.

7. An output interface circuit according to claim 2 further comprising a second CMOS circuit including a pair of complementary MOS transistors having their gates connected to receive said input signal, and a second bipolar transistor having its base connected to the drain of said MOS transistor constituting said control circuit, its collector connected to the base of said bipolar transistor and its emitter connected to the junction between said paired MOS transistors constituting said second CMO circuit.

8. An output interface circuit according to claim 7 further comprising means for supplying a current to the base of said bipolar transistor.

9. An output interface circuit according to claim 1 further comprising a control signal generator for supplying a control signal to said control circuit.

10. An output interface circuit according to claim 9 wherein said control signal generator generates the control signal by dividing a voltage across first and second power supplies between which said CMOS circuit is connected.

11. An output interface circuit according to claim 9 wherein said control signal generator comprises a circuit equivalent to said control circuit, reference voltage generator means for supplying a reference voltage to said equivalent circuit, resistor means for converting current flowing through said equivalent circuit into voltage, and an inverter for amplifying the voltage and producing an output signal which is fed back to said equivalent circuit and used as said control signal.

12. An output interface circuit according to claim 7 further comprising a control signal generator including a circuit equivalent to said control circuit, reference voltage generator means for supplying a reference voltage to said equivalent circuit, a bipolar transistor equivalent to said second bipolar transistor and having its base connected to receive a current flowing trough said equivalent circuit, resistor means for converting collector current of said equivalent bipolar transistor into voltage, and an inverter for amplifying the voltage and producing an output signal which is fed back to said equivalent circuit and used as said control signal.

13. An output interface circuit comprising:
 a CMOS inverter for receiving an input signal of CMOS level;
 a bipolar transistor connected to the output of said CMOS inverter and producing a output signal of ECL level, said bipolar transistor being operable as an emitter follower;
 a circuit connected between a pair of complementary MOS transistors constituting said CMOS inverter and operable to cut off a current flowing through any one of said paired MOS transistors when the base potential of said bipolar transistor decreases to reach a predetermined level which is about 0.5 to 0.8 volts higher than the low level of ECL level.

14. An output interface circuit according to claim 13 wherein said current cut-off circuit comprises a MOS transistor connected between said pair of complementary MOS transistors constituting said CMOS inverter and having its gate connected to receive a control signal.

15. An output interface circuit according to claim 14 further comprising a capacitor connected in parallel with said current cut-off circuit between said paired MOS transistors.

16. An output interface circuit according to claim 14 further comprising a MOS transistor having its gate connected to receive the input signal, its drain connected to the drain of said MOS transistor constituting said current cut-off circuit and its source connected to a first power supply.

17. An output interface circuit according to claim 13 further comprising means, connected to the emitter of said transistor operable as an emitter follower, for clamping the low level of said output signal.

18. An output interface circuit according to claim 13 further comprising means for supplying a current to the base of said transistor operable as an emitter 19. An output interface circuit according to claim 13 further comprising a control signal generator for supplying a control signal to said current cut-off circuit.

20. An output interface circuit according to claim 19 wherein said control signal generator generates the control signal by dividing a voltage across first and second power supplies between which said CMOS inverter is connected.

21. An output interface circuit according to claim 19 wherein said control signal generator comprises a circuit equivalent to said current cut-off circuit, reference voltage generator means for supplying a reference voltage to said equivalent circuit, resistor means for converting current flowing through said equivalent circuit into voltage, and an inverter for amplifying the voltage and producing an output signal which is fed back to said equivalent circuit and used as said control signal.

22. An output interface circuit according to claim 14 further comprising a second CMOS inverter including a pair of complementary MOS transistors having their gates connected to receive said input signal, and a second bipolar transistor having its base connected to the drain of said MOS transistor constituting said current cut-off circuit, its collector connected to the base of said bipolar transistor and its emitter connected to the junction between said paired MOS transistors constituting said CMOS inverter.

23. An output interface circuit according to claim 22 further comprising means for supplying a current to the base of said bipolar transistor.

24. An output interface circuit according to claim 22 further comprising a control signal generator including a circuit equivalent to said current cut-off circuit, reference voltage generator means for supplying a reference voltage to said equivalent circuit, a bipolar transistor equivalent to said second bipolar transistor and having its base connected to receive a current flowing said equivalent circuit, resistor means for converting collector current of said equivalent bipolar transistor into voltage, and an inverter for amplifying the voltage are producing an output signal which is fed back to said equivalent circuit and used as said control signal.

25. An output interface circuit comprising:
 a CMOS inverter including a pair of complementary MOS transistors and receiving an input signal at the gates of said paired MOS transistors;
 a bipolar transistor having its base connected to the output of said CMOS inverter and its emitter from which an output signal is delivered; and
 a control circuit connected between said paired MOS transistors and operable to control the low level at the output of said CMOS inverter such that said low level does not fall below a predetermined level which is about 0.5 to 0.8 volts higher than the low level of the output signal of said bipolar transistor.

26. An output interface circuit according to claim 25 wherein said control circuit comprises a MOS transistor having its source and drain connected between said paired MOS transistors and its gate applied with a control signal.

27. An output interface circuit according to claim 26 further comprising a capacitor connected in parallel with said control circuit between said paired MOS transistors.

28. An output interface circuit according to claim 27 further comprising a MOS transistor having its gate connected to receive the input signal, its drain connected to the drain of said MOS transistor constituting said control circuit and its source connected to a first power supply.

29. An output interface circuit according to claim 28 further comprising means for supplying a current to the base of said bipolar transistor.

30. An output interface circuit according to claim 25 further comprising a control signal generator for supplying a control signal to said control circuit.

31. An output interface circuit according to claim 30 wherein said control signal generator comprises a circuit equivalent to said control circuit, reference voltage generator means for supplying a reference voltage to said equivalent circuit, resistor means for converting current flowing through said equivalent circuit into voltage, and an inverter for amplifying the voltage and producing an output signal which is fed back to said equivalent circuit and used as said control signal.

32. An output interface circuit comprising:
a CMOS circuit including a pair of complementary MOS transistors and receiving an input signal at the gates of said MOS transistors;
a bipolar transistor having its base connected to the output of said CMOS circuit and its emitter from which an output signal is delivered; and
a circuit connected between said paired MOS transistors and operable to cut off a current flowing through any one of said paired MOS transistors when the base potential of said bipolar transistor decreases to reach a predetermined level at which said bipolar transistor is substantially turned off.

33. An output interface circuit according to claim 32 wherein said current cut-off circuit comprises a MOS transistor having its source and drain connected between said paired MOS transistors and its gate applied with a control signal.

34. An output interface circuit according to claim 33 further comprising a control signal generator for supplying the control signal to said current cut-off circuit.

35. An output interface circuit according to claim 34 wherein said control signal generator comprises a circuit equivalent to said current cut-off circuit, reference voltage generator means for supplying a reference voltage to said equivalent circuit, resistor means for converting current flowing through said equivalent circuit into voltage, and an inverter for amplifying the voltage and producing an output signal which is fed back t said equivalent circuit and used as said control signal.

36. An output interface circuit according to claim 35 further comprising a capacitor connected in parallel with said current cut-off circuit between said paired MOS transistors.

37. An output interface circuit according to claim 36 further comprising a MOS transistor having its base connected to receive the input signal, its drain connected to the drain of said MOS transistor constituting said current cut-off circuit and its source connected to a first power supply.

38. An output interface circuit according to claim 37 further comprising means for supplying a current to the base of said bipolar transistor.

39. An output interface circuit comprising:
a first P-type MOS transistor having its source connected to a first power supply;
a first N-type MOS transistor having its source connected to a second power supply;
a first NPN-type bipolar transistor having its emitter connected to an output terminal and its collector connected to a third power supply, the gates of said first P-type MOS transistor and first N-type transistor being connected in common to said input terminal or those gates being connected in common to the node which gives the same polarity and amplitude of an input signal at an input terminal, so that upon the output rise, the base current is supplied to said first NPN-type bipolar transistor through the drain of said first P-type MOS transistor and charges in the base of said first NPN-type bipolar transistor flows through the drain of said first N-type MOS transistor; and
a circuit operable, upon the output fall, to cut off a current flowing between the base of said first NPN-type bipolar transistor and the drain of said first N-type MOS transistor when the base potential of said first NPN-type bipolar transistor decreases to reach a predetermined level which is about 0.5 to 0.8 volts higher than the low level at the output terminal.

40. An output interface circuit according to claim 39 wherein said current cut-off circuit comprises a second P-type MOS transistor having its source connected to the base of said first NPN-type bipolar transistor, its drain connected to the drain of said first N-type MOS transistor and its gate applied with a control voltage prescribing said predetermined level.

41. An output interface circuit according to claim 40 further comprising a capacitor connected between the base of said first NPN-type bipolar transistor and the junction between the drains of said first N-type MOS transistor and second P-type MOS transistor.

42. An output interface circuit according to claim 41 further comprising a third P-type MOS transistor having its drain connected to the drain of said first N-type MOS transistor, its source connected to said first power supply and its gate connected to the gate of said first P-type MOS transistor.

43. An output interface circuit according to claim 42 further comprising a fourth P-type MOS transistor having substantially the same configuration as said second P-type MOS transistor, reference voltage generator means connected between the source of said fourth P-type MOS transistor and said first power supply, resistor means for converting current flowing through said fourth P-type MOS transistor into voltage, an inverter comprised of an even number of stages for amplifying the voltage, and means for feedback of an output signal of said inverter to the gate of said fourth P-type MOS transistor, said output signal of said inverter being used as said control voltage.

44. An output interface circuit according to claim 39 further comprising current supply means connected between the base of said first NPN-type bipolar transistor and said first power supply.

45. An output interface circuit according to claim 44 wherein said current supply means comprises such an element as a resistor, a diode, a MOS transistor having its gate applied with a fixed voltage, a MOS transistor having its drain and gate connected together, or a series or parallel connection of these elements.

46. An output interface circuit according to claim 43 wherein said reference voltage generator means comprises such an element as resistor means, a diode, or a series or parallel connection of these elements to generate a reference voltage in the form of a voltage drop across said element due to a current flowing therethrough 47. An output interface circuit according to claim 43 wherein said resistor means comprises a diffused resistor layer in a semiconductor, a resistor formed of a polysilicon layer, or drain/source resistance of a MOS transistor.

* * * * *